(12) United States Patent
Chouaib et al.

(10) Patent No.: US 12,380,367 B2
(45) Date of Patent: Aug. 5, 2025

(54) METROLOGY IN THE PRESENCE OF CMOS UNDER ARRAY (CUA) STRUCTURES UTILIZING MACHINE LEARNING AND PHYSICAL MODELING

(71) Applicant: KLA Corporation, Milpitas, CA (US)

(72) Inventors: Houssam Chouaib, San Jose, CA (US); Zhaxylyk Kudyshev, Milpitas, CA (US); Chao Chang, Milpitas, CA (US); Derrick A. Shaughnessy, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 136 days.

(21) Appl. No.: 18/217,290

(22) Filed: Jun. 30, 2023

(65) Prior Publication Data

US 2025/0005435 A1    Jan. 2, 2025

(51) Int. Cl.
*G06N 20/00*    (2019.01)

(52) U.S. Cl.
CPC .................................... *G06N 20/00* (2019.01)

(58) Field of Classification Search
CPC ........ G06N 20/00; G01B 11/24; G01B 11/02; G01B 11/06; G01N 21/95; G03F 7/20; H01L 21/66; H01L 21/67; H01L 27/11582

See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,929,667 B1 | 4/2011 | Zhuang et al. |
| 7,933,026 B2 | 4/2011 | Opsal et al. |

(Continued)

OTHER PUBLICATIONS

Korean Intellectual Property Office, International Search Report and Written Opinion received in International Application No. PCT/US2024/034887, Oct. 15, 2024, 7 pages.

(Continued)

*Primary Examiner* — Dave Misir
(74) *Attorney, Agent, or Firm* — Suiter Swantz IP

(57) ABSTRACT

A system may include a controller including processors configured to execute program instructions causing the processors to implement a measurement recipe by: generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures; generating a measurement model for determining measurements of the CuA devices; receiving full loop optical measurement data for CuA devices test samples; converting the full loop optical measurement data to short loop optical measurement data using the transformation model; and determining values of the measurements of the periodic memory array structures on the test samples using the measurement model.

22 Claims, 6 Drawing Sheets

(56) References Cited

U.S. PATENT DOCUMENTS

| | | |
|---|---|---|
| 9,291,554 B2 | 3/2016 | Kuznetsov et al. |
| 9,885,962 B2 | 2/2018 | Veldman et al. |
| 9,915,522 B1 | 3/2018 | Jiang et al. |
| 10,013,518 B2 | 7/2018 | Bakeman et al. |
| 10,101,670 B2 | 10/2018 | Pandev et al. |
| 10,324,050 B2 | 6/2019 | Hench et al. |
| 10,345,095 B1 | 7/2019 | Pandev et al. |
| 10,352,695 B2 | 7/2019 | Dziura et al. |
| 10,458,912 B2 | 10/2019 | Chouaib et al. |
| 10,502,694 B2 | 12/2019 | Dziura et al. |
| 10,769,320 B2 | 9/2020 | Kuznetsov et al. |
| 10,775,323 B2 | 9/2020 | Gellineau et al. |
| 10,794,839 B2 | 10/2020 | Rosenberg et al. |
| 11,036,898 B2 | 6/2021 | Chouaib et al. |
| 11,156,548 B2 | 10/2021 | Nguyen et al. |
| 11,333,621 B2 | 5/2022 | Wack et al. |
| 11,555,689 B2 | 1/2023 | Chouaib et al. |
| 11,573,077 B2 | 2/2023 | Chouaib et al. |
| 2014/0172394 A1 | 6/2014 | Kuznetsov et al. |
| 2015/0032398 A1* | 1/2015 | Peterlinz ............. G01N 23/203 702/81 |
| 2015/0046118 A1 | 2/2015 | Pandev et al. |
| 2015/0046121 A1 | 2/2015 | Dziura et al. |
| 2018/0106735 A1 | 4/2018 | Gellineau et al. |
| 2018/0108578 A1 | 4/2018 | Pandev et al. |
| 2019/0017946 A1 | 1/2019 | Wack et al. |
| 2020/0168513 A1 | 5/2020 | Sawai |
| 2021/0109453 A1 | 4/2021 | Pandev |
| 2021/0207956 A1 | 7/2021 | Shchegrov et al. |
| 2022/0309645 A1* | 9/2022 | Tenner ................. G01N 21/956 |
| 2024/0271926 A1* | 8/2024 | Shafir ................... G01B 11/06 |

OTHER PUBLICATIONS

Kline et al., "X-ray scattering critical dimensional metrology using a compact x-ray source for next generation semiconductor devices," Journal of Micro/Nanolithography, MEMS and MOEMS, Jan.-Mar. 2017, 11 pages.

Lemaillet et al., "Intercomparison between optical and x-ray scatterometry measurements of FinFET structures," Proceedings of SPIE—The International Society for Optical Engineering, Apr. 2013, 8 pages.

* cited by examiner

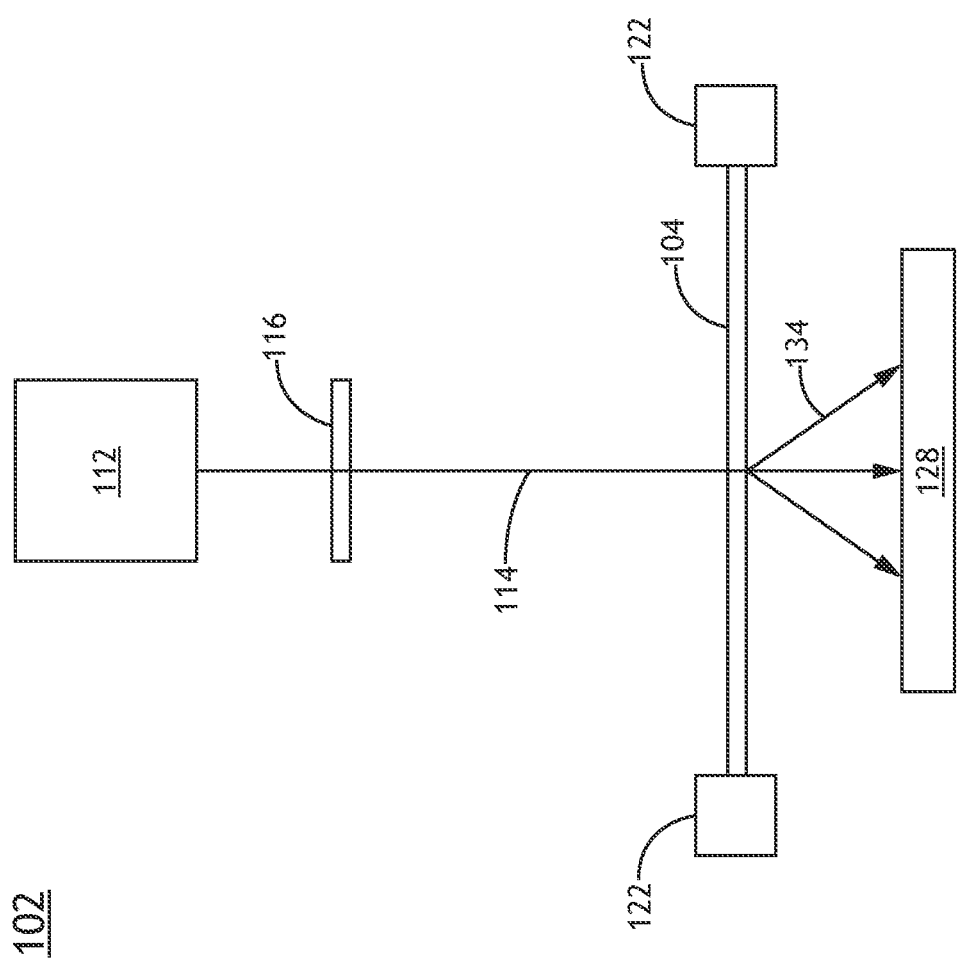

METROLOGY IN THE PRESENCE OF CMOS UNDER ARRAY (CUA) STRUCTURES UTILIZING MACHINE LEARNING AND PHYSICAL MODELING

TECHNICAL FIELD

The present disclosure relates generally to optical metrology and, more particularly, to optical metrology of memory structures including buried CMOS structures.

BACKGROUND

One approach to meeting demands for increased performance of memory devices (e.g., 3D memory devices) while maintaining or reducing physical size is to fabricate CMOS circuitry (e.g., logic circuitry) beneath memory array structures. This approach is commonly referred to as a complementary metal-oxide-semiconductor (CMOS) under array (CuA) technique. However, CuA techniques present unique challenges for metrology systems used for process control since the underlying CMOS circuitry may influence measurements of the memory array structures. There is therefore a need to develop systems and methods to address the above challenges.

SUMMARY

A system is disclosed in accordance with one or more illustrative embodiments of the present disclosure. In embodiments, the system includes a controller including one or more processors configured to execute program instructions causing the one or more processors to implement a measurement recipe by: generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures; generating a measurement model for determining one or more measurements of the CuA devices based on the short loop optical measurement data; receiving full loop optical measurement data for CuA devices on one or more test samples; converting the full loop optical measurement data for the CuA devices on the one or more test samples to short loop optical measurement data for the CuA devices on the one or more test samples using the transformation model; and determining values of the one or more measurements of the periodic memory array structures on the one or more test samples using the measurement model with the short loop optical measurement data for the CuA devices.

A system is disclosed in accordance with one or more illustrative embodiments of the present disclosure. In embodiments, the system includes an optical characterization system. In embodiments, the system includes a controller communicatively coupled with the optical characterization system and a reference characterization system, the controller including one or more processors configured to execute program instructions causing the one or more processors to implement a measurement recipe by: generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures; generating a measurement model for determining one or more measurements of the CuA devices based on the short loop optical measurement data; receiving full loop optical measurement data for CuA devices on one or more test samples; converting the full loop optical measurement data for the CuA devices on the one or more test samples to short loop optical measurement data for the CuA devices on the one or more test samples using the transformation model; and determining values of the one or more measurements of the periodic memory array structures on the one or more test samples using the measurement model with the short loop optical measurement data for the CuA devices.

A method is disclosed, in accordance with one or more illustrative embodiments of the present disclosure. In embodiments, the method includes generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures. In embodiments, the method includes generating a measurement model for determining one or more measurements of the CuA devices based on the short loop optical measurement data. In embodiments, the method includes generating full loop optical measurement data for CuA devices on one or more test samples. In embodiments, the method includes converting the full loop optical measurement data for the CuA devices on the one or more test samples to short loop optical measurement data for the CuA devices on the one or more test samples using the transformation model. In embodiments, the method includes determining values of the one or more measurements of the periodic memory array structures on the one or more test samples using the measurement model with the short loop optical measurement data for the CuA devices.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 1C is a simplified schematic of the characterization sub-system configured as an x-ray characterization sub-system, in accordance with one or more embodiments of the present disclosure.

DETAILED DESCRIPTION

Figure 1A:
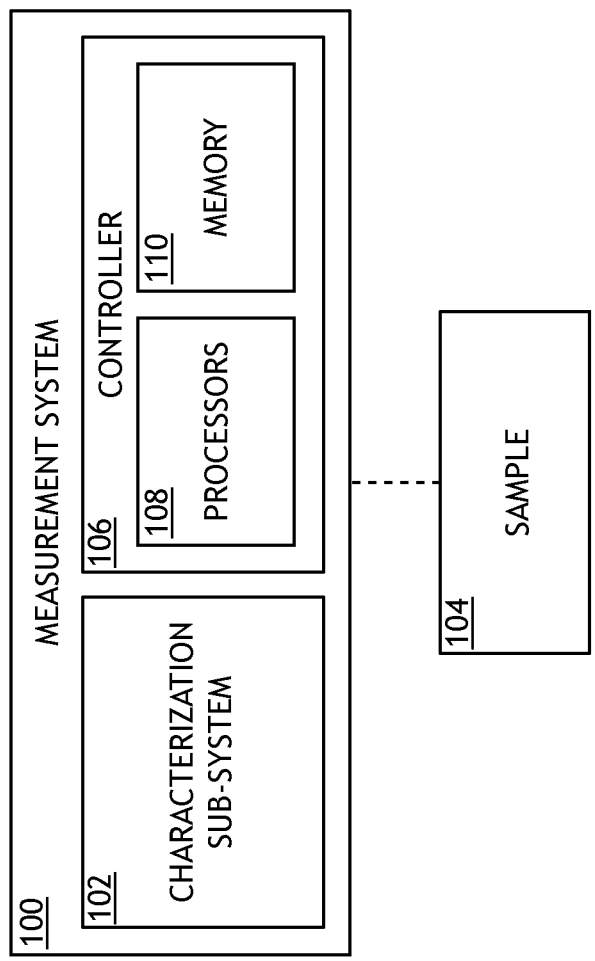
FIG. 1A is a block diagram of a measurement system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for optical metrology of complementary metal-oxide-semiconductor (CMOS) under array (CuA) devices based on transforming full loop optical measurement data of fully-fabricated CuA devices to short loop optical measurement data associated with a simulation of optical measurement data without buried CMOS structures and then generating measurements based on the short loop optical measurement data.

A CuA structure (e.g., a CuA memory structure) may generally include logic circuitry (e.g., CMOS logic circuitry, or the like) physically located beneath duplicates of memory array structures (e.g., 3-dimensional (3D) memory stacks, 3D NAND structures, or the like). As used herein, the term CuA structure may cover a wide variety of designs of the logic and memory array structures. In this way, the present disclosure is not limited to any particular CuA architecture.

Optical metrology is commonly used for semiconductor process control since it may provide relatively high measurement throughput and is typically non-destructive. In optical metrology, a sample is illuminated with light and a measurement is generated based on corresponding light emanating from the sample. Optical metrology of sub-surface features typically requires that light propagate through at least upper portions of the sample to reach the sub-surface features of interest. As a result, optical metrology systems typically utilize wavelengths of light selected to propagate through the structures of interest with relatively low absorption.

However, in the case of CuA structures, incident light may interact with both memory array structures and buried CMOS structures in a way that may impair the ability to generate isolated measurements for the memory array structures. It is contemplated herein that existing optical metrology techniques may be inadequate to accurately characterize CuA structures, particularly as the dimensions shrink and device complexity increases. For example, some techniques may rely on wavelengths of light that are in a transparency window for the memory array structures of interest, but may be at least partially absorbed by the underlying logic circuitry. As an illustration, some logic circuitry may utilize poly-silicon layers that absorb light with wavelengths greater than around 450 nanometers (nm). In this case, optical metrology with wavelengths lower than about 450 nm may generate isolated measurements of memory array structures. However, such a technique may be limited to select CuA designs that incorporate such absorbing materials, may provide limited sensitivity for deep structures, and may further provide limited value for broadband optical measurement methods that benefit from multi-wavelength data. As another example, some techniques rely on supervised training of artificial neural networks using optical measurement data with labels generated through additional measurement methods. However, these techniques may have various limitations such as, but not limited to, a requirement of high sampling of ground truth reference data, substantial time required to generate sufficient labels for training, limited performance for deeply buried structures, insensitivity to process changes, and general inapplicability for CuA structures outside the training dataset.

In some embodiments, a measurement model suitable for receiving and generating measurements of the memory array structures based only on received short loop optical measurement data is generated. In some embodiments, a transformation model is generated that transforms or otherwise converts full loop optical measurement data into short loop optical measurement data. In this way, full loop optical measurement data may be generated during a production process and converted into short loop optical measurement data such that measurements of fabricated CuA devices may be generated based on the short loop measurement model.

It is contemplated herein that a physics-based measurement model based on memory array structures alone (e.g., a short loop measurement model) may provide numerous advantages over a physics-based measurement model based on full CuA devices (e.g., a full loop measurement model) such as, but not limited to, a reduced sample depth that must be simulated, simplified and/or fewer interfaces to model, commensurate computational resources required (or simulation time with a given set of computational resources), or robustness of the modeled result. In this way, systems and methods disclosed herein may be superior to an alternative utilizing a physics-based model based on full loop optical measurement data.

Referring now to FIGS. 1A-3, systems and methods for characterizing CuA structures are described in greater detail, in accordance with one or more embodiments of the present disclosure.

FIG. 1A is a block diagram of a measurement system 100, in accordance with one or more embodiments of the present disclosure. In some embodiments, the measurement system 100 includes a characterization sub-system 102 to generate measurement data of a sample 104 using optical techniques and a controller 106 to generate one or more measurements based on the measurement data.

The characterization sub-system 102 may include any components or combination of components suitable for generating measurement data on a sample 104.

In some embodiments, the characterization sub-system 102 includes an optical characterization sub-system 102 to generate measurement data based on interaction of the sample 104 with light. For example, the characterization sub-system 102 may include, but is not limited to, a spectroscopic ellipsometer (SE), an SE with multiple angles of illumination, an SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, a scatterometer (e.g., speckle analyzer), or any combination thereof.

In some embodiments, the characterization sub-system 102 includes an x-ray characterization sub-system 102 to generate measurement data based on interaction of the sample 104 with x-rays. For example, the characterization sub-system 102 may include, but is not limited to, a small-angle x-ray scattering (SAXS) system or an x-ray reflection scatterometry (SXR) system.

In some embodiments, the characterization sub-system 102 includes a particle-beam characterization sub-system 102 to generate measurement data based on interaction of the sample 104 with a particle beam such as, but not limited to, an electron beam (e-beam), an ion beam, or a neutral particle beam.

In some embodiments, a characterization sub-system 102 provides multiple types of measurements. In some embodiments, a measurement system 100 includes multiple measurement sub-systems 102, each providing a different combination of one or more measurements. Further, the measurement system 100 may be provided as a single tool or multiple tools. A single tool providing multiple measurement configurations is generally described in U.S. Pat. No. 7,933,026 issued on Apr. 26, 2011, which is incorporated herein by reference in its entirety. Multiple tool and structure analysis is generally described in U.S. Pat. No. 7,478,019 issued on Jan. 13, 2009, which is incorporated herein by reference in its entirety.

Further, U.S. Pat. No. 10,458,912, titled "Model based optical measurements of semiconductor structures with anisotropic dielectric permittivity," issued on Oct. 29, 2019; U.S. Pat. No. 11,573,077, titled "Scatterometry based methods and systems for measurement of strain in semiconductor structures," issued on Feb. 7, 2023; U.S. Pat. No. 11,036,898, titled "Measurement models of nanowire semiconductor structures based on re-useable sub-structures," issued on Jun. 15, 2021; U.S. Pat. No. 11,555,689, titled "Measuring thin films on grating and bandgap on grating," issued on Jan. 17, 2023; U.S. Pat. No. 11,156,548, titled "Measurement methodology of advanced nanostructures," issued on Oct. 26, 2021; and U.S. Pat. No. 10,794,839, titled "Visualization of three-dimensional semiconductor structures," issued on Oct. 6, 2020, which are all incorporated herein by reference in their entirety.

In some embodiments, the controller 106 includes one or more processors 108 configured to execute a set of program instructions maintained in a memory 110, or memory device, where the program instructions may cause the processors 108 to implement various actions.

The one or more processors 108 of a controller 106 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 108 may include any device configured to execute algorithms and/or instructions (e.g., program instructions stored in memory). In some embodiments, the one or more processors 108 may be embodied as a desktop computer, mainframe computer system, workstation, image computer, parallel processor, networked computer, or any other computer system configured to execute a program configured to operate or operate in conjunction with the characterization sub-system 102, as described throughout the present disclosure. Moreover, different subsystems of the measurement system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 106 may include one or more controllers housed in a common housing or within multiple housings. In this way, any controller or combination of controllers may be separately packaged as a module suitable for integration into measurement system 100.

The memory 110 may include any storage medium known in the art suitable for storing program instructions executable by the associated one or more processors 108. For example, the memory 110 may include a non-transitory memory medium. By way of another example, the memory 110 may include, but is not limited to, a read-only memory (ROM), a random-access memory (RAM), a magnetic or optical memory device (e.g., disk), a magnetic tape, a solid-state drive and the like. It is further noted that the memory 110 may be housed in a common controller housing with the one or more processors 108. In some embodiments, the memory 110 may be located remotely with respect to the physical location of the one or more processors 108 and the controller 106. For instance, the one or more processors 108 of the controller 106 may access a remote memory (e.g., server), accessible through a network (e.g., internet, intranet and the like).

The controller 106 may be communicatively coupled with any component or combination of components of the measurement system 100. In some embodiments, the controller 106 may receive data (e.g., measurement data, or the like) from one or more components of the measurement system 100. In some embodiments, the controller 106 controls one or more components of the measurement system 100 via drive signals. More generally, the controller 106 may implement any steps described in the present disclosure.

In some embodiments, the controller 106 generates one or more measurements of the sample 104 based at least in part on measurement data generated by the characterization sub-system 102. Measurements of parameters of interest may include a number of algorithms, which may be executed by the controller 106. For example, optical interaction of the incident beam with the sample 104 may be modeled using an EM (electro-magnetic) solver and may utilize algorithms as, but not limited to, rigorous coupled-wave analysis (RCWA), finite element method (FEM), method of moments, surface integral method, volume integral method, or finite-difference time-domain (FDTD) method. The sample 104 may be modeled (e.g., parametrized) using a geometric engine, a process modeling engine, or a combination of both. The use of process modeling is generally described in U.S. Pat. No. 10,769,320 issued on Sep. 8, 2020, which is incorporated herein by reference in its entirety. A geometric engine is implemented, for example, in AcuShape software by KLA Corporation.

The controller 106 may analyze collected measurement data using any suitable combination of data fitting and/or optimization techniques such as, but not limited to, libraries, fast-reduced-order models, regression, statistical methods, see e.g., "Statistical model-based metrology," by S. Pandev et al, U.S. Pat. No. 10,101,670; machine-learning algorithms (e.g., neural networks, support-vector machines (SVM), principal component analysis (PCA), independent component analysis (ICA), local-linear embedding (LLE), dimensionality reduction techniques more generally), sparse representation techniques, Fourier transform techniques, wavelet transform techniques, or Kalman filtering. Statistical model-based metrology is generally described in U.S. Pat. No. 10,101,670 issued on Oct. 16, 2018, which is incorporated herein by reference in its entirety. The controller 106 may analyze collected measurement data using algorithms that do not include modeling, optimization, and/or fitting. Patterned wafer characterization is generally described in U.S. Pat. No. 10,502,694 issued on Dec. 10, 2019, which is incorporated herein by reference in its entirety. In some embodiments, the controller 106 utilizes one or more algorithms to promote matching from the same or different tool types (e.g., different instances or configurations of a characterization sub-system 102).

The controller 106 may be designed to provide efficient performance through any suitable techniques such as, but not limited to, parallelization, distribution of computation, load balancing, multi-service support, dynamic load optimization, or the like. Further, the controller 106 may implement any steps using any type or combination of configurations such as, but not limited to, dedicated hardware (e.g., FPGAs, or the like), software, or firmware.

The controller 106 may further generate any type of measurement of the sample 104 (or a portion thereof) based at least in part on measurement data from the characterization sub-system 102. In some embodiments, the controller 106 generates a metrology measurement such as, but not limited to, an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, or a measurement of process conditions (e.g., focus and/or dose conditions, a resist state, a partial pressure, a temperature, a focusing model, or the like). In some embodiments, the controller 106 generates an inspection measurement in which one or more defects on the sample 104 are at least one of identified or classified.

The measurement system 100 and any of its components (e.g., the characterization sub-system 102, the controller 106, or the like) may be configured to implement a recipe (e.g., a measurement recipe), which may define various configuration parameters and/or steps to be performed in a measurement or a series of measurements.

For example, a recipe may include various aspects of a design of a sample 104 (e.g., a design of CuA devices 202 on a sample 104) including, but not limited to, a layout of features on one or more sample layers, feature sizes, or feature pitches. As another example, a recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters. By way of another example, a recipe may include various processing steps (e.g., that may be implemented by the controller 106) to generate measurements based on measurement data generated according to the recipe.

Figure 2:
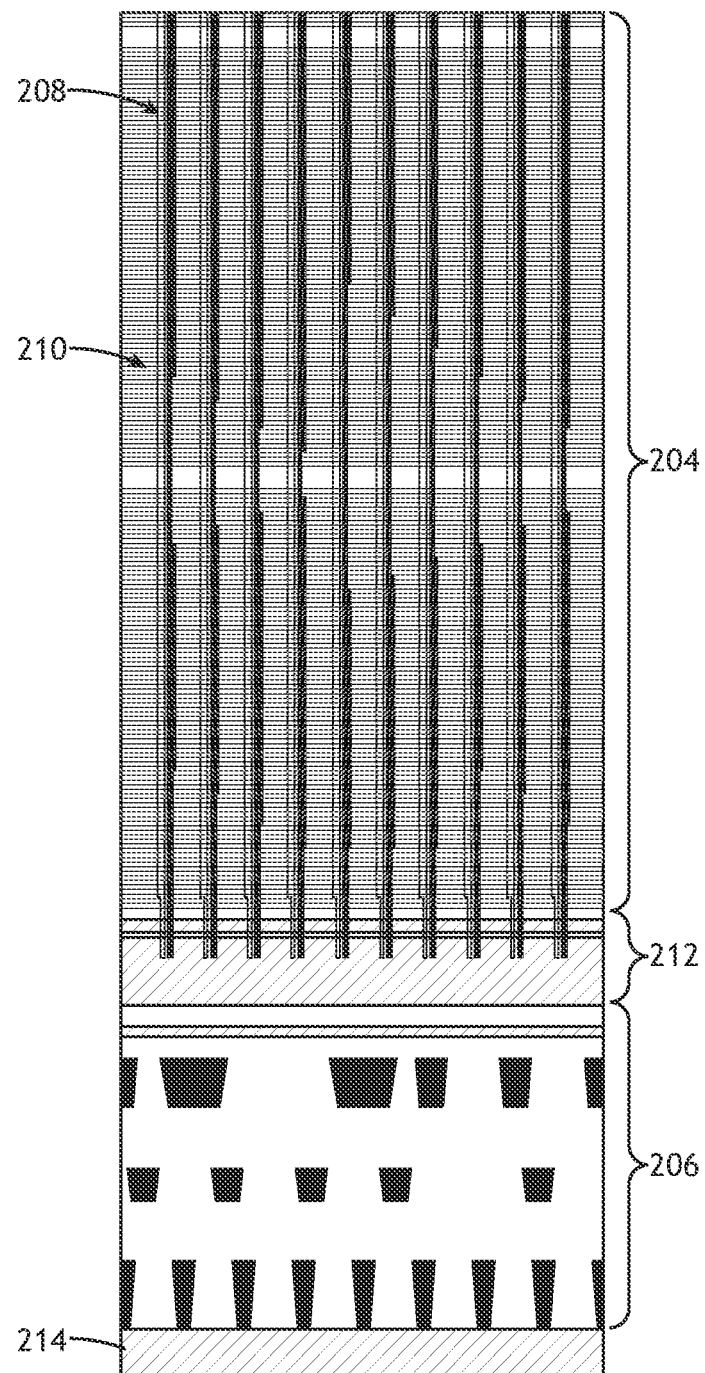
FIG. 2 is a simplified schematic of a CuA device, in accordance with one or more embodiments of the present disclosure.

Referring now to FIG. 2, FIG. 2 is a simplified schematic of a CuA device 202, in accordance with one or more embodiments of the present disclosure. A CuA device 202 may include memory array structures 204 and various CMOS structures 206 (e.g., logic structures, or the like) located beneath duplicates of the memory array structures 204. For example, the full loop optical measurement data and the short loop measurement data may have the same set of memory array structures 204 (e.g., duplicates of the memory array structures 204). This may be associated with a design of experiments (DOE) with known variations.

The memory array structures 204 may include any number or type of structures suitable for forming a memory array. For example, the memory array structures 204 may include, but are not limited to, 3D NAND structures formed from patterned features 208 within a multi-layer stack 210. Further, such memory array structures 204 are typically periodic structures with periodicity along one or more dimensions.

The CMOS structures 206 may include any number or type of structures fabricated beneath duplicates of the memory array structures 204. For example, the CMOS structures 206 may be, but are not required to be, suitable for controlling and/or powering the memory array structures 204. In this way, the combination of the CMOS structures 206 and the memory array structures 204 may form a memory device (e.g., a 3D memory device). Further, the CMOS structures 206 may typically have a spatially-varying distribution such that the number and/or design of the constituent features may not be periodic across the CuA device 202. In this way, the CMOS structures 206 may generally be described as non-periodic. However, it is noted that CMOS structures 206 may exhibit local periodicity in some regions.

Further, the memory array structures 204 and/or the CMOS structures 206 may generally have any design such that the term CuA device 202 as used herein is not limited to any particular design. For example, a CuA device 202 may include intervening layers between the memory array structures 204 and the CMOS structures 206 such as, but not limited to, a source layer 212 (e.g., a poly-silicon source layer, or the like). As another example, though not shown, a CuA device 202 may include intervening layers between the CMOS structures 206 and a substrate 214.

Figure 3:
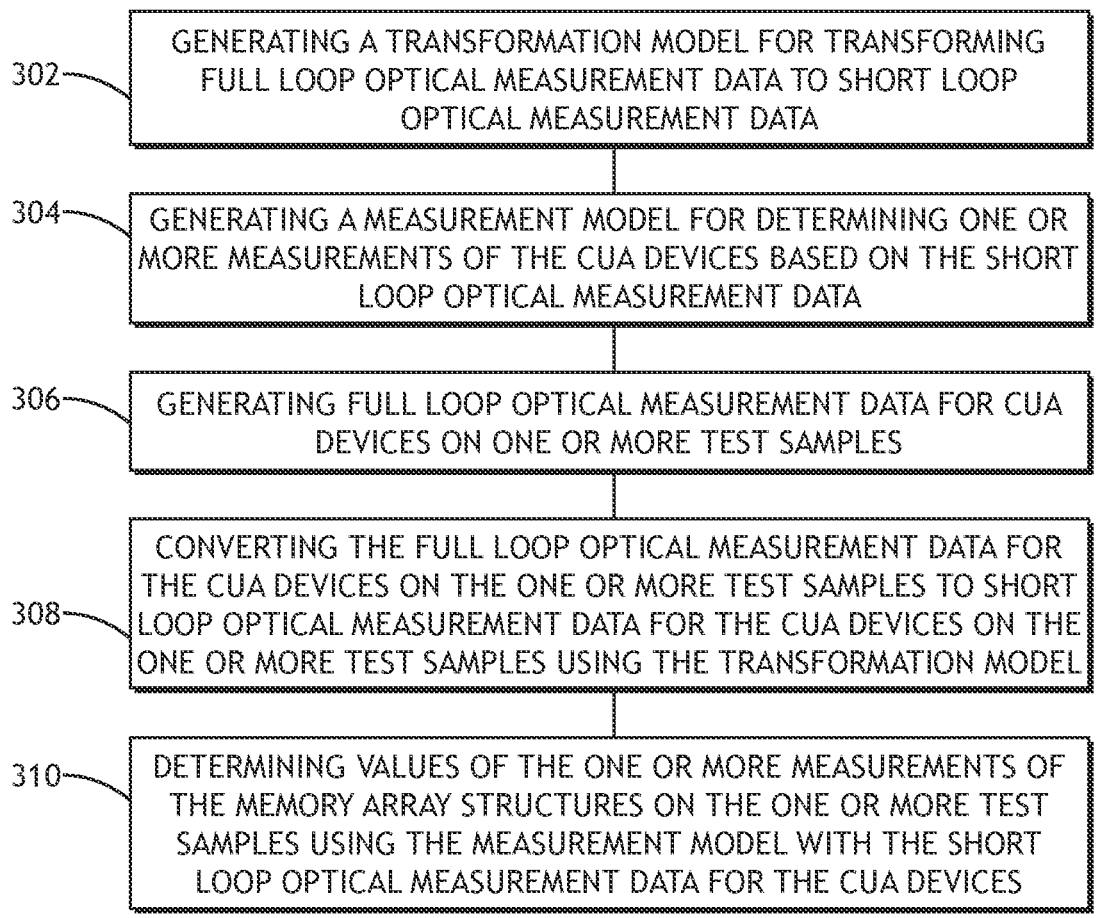
FIG. 3 is a flow diagram illustrating steps performed in a method for characterizing CuA devices, in accordance with one or more embodiments of the present disclosure.

Referring now to FIG. 3, techniques for characterizing CuA devices 202 or portions thereof are described in greater detail, in accordance with one or more embodiments of the present disclosure.

It may be desirable to generate measurements of the constituent structures of a CuA device 202 (e.g., the CMOS structures 206 and/or the memory array structures 204) at various stages of a fabrication process. Such measurements may include, but are not limited to, metrology measurements or defect measurements (e.g., inspection measurements). Metrology measurements may include, but are not limited to, an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, or a measurement of process conditions (e.g., focus and/or dose conditions, a resist state, a partial pressure, a temperature, a focusing model, or the like). Inspection measurements may include, but are not limited to, identification and/or characterization of defects of a fabrication process (e.g., unwanted features, missing features, improperly shaped or positioned features, or the like). Further, such measurements may be used for a wide variety of purposes including, but not limited to, process control, disposition, or for estimating performance of fabricated CuA devices 202.

Measurements may be generated after any process step for the fabrication of a CuA device 202. For example, measurements may be generated after the fabrication of CMOS structures 206 and/or after the fabrication of memory array structures 204 to form a full CuA device 202. For the purposes of illustration, measurements of a full CuA device 202 including both memory array structures 204 and underlying CMOS structures 206 are referred to herein as "full loop" measurements.

It is contemplated herein that measurements at one process step may generally provide information about any features fabricated on the sample 104 depending on the interaction of an illumination beam 114 with the sample 104. In this way, it may be challenging to perform isolated measurements of newly fabricated features. For example, full loop measurements may generally provide information for or be impacted by both the memory array structures 204 and underlying CMOS structures 206, which may limit or impair the ability to generate isolated measurements of the memory array structures 204.

In some embodiments, measurements of various test structures may be generated to assist in generating isolated measurements of certain features. For example, measurements of a test structure including memory array structures 204 without corresponding buried CMOS structures 206 are referred to herein as "short loop" measurements.

Further, measurements at any process step may generally be generated using any suitable technique including, but not limited to, optical techniques, x-ray techniques, particle-based techniques, or the like. However, different measurement techniques may provide different tradeoffs. For example, optical measurement techniques may generally provide non-destructive measurements with a high measurement throughput but may have limited resolution or may be limited to certain types of structures (e.g., periodic structures) based on the corresponding analysis or modeling steps. Optical measurements are thus commonly utilized during run-time when throughput is particularly important. As another example, x-ray and/or particle-based techniques may provide higher resolution than some optical techniques but may suffer from relatively low throughput and/or may be destructive measurements. As a result, such techniques are commonly used for reference measurements.

However, it is contemplated herein that it may not be feasible or desirable in all applications to generate all possible types of measurements at all measurement steps. In such cases, different techniques may be utilized to generate measurements of specific structures (e.g., isolated measurements of memory array structures 204) depending on available data.

FIG. 3 is a flow diagram illustrating steps performed in a method 300 for characterizing CuA devices 202, in accordance with one or more embodiments of the present disclosure. Applicant notes that the embodiments and enabling technologies described previously herein in the context of the measurement system 100 should be interpreted to extend to the method 300. For example, any of the steps associated with the method 300 may be implemented by the controller 106 and/or a characterization sub-system 102 of the measurement system 100. It is further noted, however, that the method 300 is not limited to the architecture of the measurement system 100.

It is contemplated herein that the method 300 may be suitable for, but not limited to, applications in which it is desirable to generate isolated measurements of memory array structures 204, where both full loop and short loop measurements are available for training purposes, but where only full loop data is desired for process control. One goal of this approach is to develop a measurement model suitable for receiving and generating measurements of the memory array structures 204 based only on received short loop optical measurement data (e.g., data from an optical characterization sub-system 102). Another goal of this approach is to develop a transformation model that transforms or otherwise converts full loop optical measurement data into short loop optical measurement data. In this way, full loop optical measurement data may be generated during a production process and converted into short loop optical measurement data such that measurements of fabricated CuA devices 202 may be generated based on the short loop measurement model.

It is contemplated herein that a physics-based measurement model based on memory array structures 204 alone (e.g., a short loop measurement model) may provide numerous advantages over a physics-based measurement model based on full CuA devices 202 (e.g., a full loop measurement model) such as, but not limited to, a reduced sample depth that must be simulated, simplified and/or fewer interfaces to model, commensurate computational resources required (or simulation time with a given set of computational resources), or robustness of the modeled result. In this way, the method 300 may be superior to an alternative utilizing a physics-based model based on full loop optical measurement data.

In some embodiments, the method 300 includes a step 302 of generating a transformation model for transforming full loop optical measurement data to short loop optical measurement data. The short loop optical measurement data includes optical measurement data of periodic memory array structures 204, while the full loop optical measurement data includes optical measurement data of CuA devices 202 having CMOS structures 206 beneath duplicates of the periodic memory array structures 204. In this way, the transformation model may remove the effects of the CMOS structures 206 from the full loop optical measurement data to simulate optical measurement data that would be generated in the absence of the CMOS structures 206.

In some embodiments, the transformation model includes a machine learning model, which may utilize any suitable type of machine learning technique known in the art and may include any combination of learning techniques including, but not limited to, supervised, unsupervised, or reinforcement learning techniques. In some embodiments, the machine learning model is a neural network model.

The machine learning model may thus generate relationships between full loop optical measurement data and short loop optical measurement data indicative of the impact of the CMOS structures 206. Once trained, the machine learning model may be used to generate short loop optical measurement data from received full loop measurement data. As a result, the machine learning model may identify and remove the impacts of the CMOS structures 206 on the optical measurement data.

The machine learning model may be trained with any suitable dataset. In some embodiments, the training data includes experimentally-generated short loop and full loop optical measurement data as well as reference data providing ground truth measurements of parameters of interest.

In some embodiments, the step 302 includes generating short loop optical measurement data for a set of periodic memory array structures 204 on one or more training samples, generating short loop reference data for the set of periodic memory array structures 204 on the one or more training samples, generating full loop optical measurement data for a set of CuA devices 202 on the one or more training samples, and generating full loop reference data for the set of CuA devices 202 on the one or more training samples.

For example, the short loop and full loop optical measurement data may be generated using an optical characterization sub-system 102. As another example, the reference data may be generated with a high-resolution characterization sub-system 102 such as, but not limited to, an x-ray characterization sub-system 102 or a particle-beam characterization sub-system 102. Non-limiting examples include, but are not limited to, transverse electron microscope (TEM) data, scanning electron microscope (SEM) data (e.g., critical dimension SEM (CD-SEM) data, electron-beam SEM (EB-SEM) data, or the like), SAXS data (e.g., transmission SAXS (T-SAXS) data, CD-SAXS data, or the like), x-ray photoelectron spectroscopy (XPS) data, or x-ray diffraction (XRD) data. It is noted that CD-SAXS data may be particularly suitable for use as reference data, but this is not limiting on the present disclosure.

The step 302 may then include training the transformation model with full loop and short loop optical measurement data as well as the full loop and short loop reference data. In this way, the training dataset may include ground truth measurements associated with the CMOS structures 206 in order to identify the contributions of those structures to the full loop optical measurement data such that these contributions may be removed in generated short loop optical measurement data.

In some embodiments, the method 300 includes a step 304 of generating a measurement model for determining one or more measurements of the CuA devices based on the short loop optical measurement data.

Any suitable measurement model may be generated in step 304.

In some embodiments, the measurement model developed in step 304 includes a physics-based model in which properties of the CuA device 202 are related to metrology measurements of interest through a model of interactions between one or more illumination beams 114 and properties of the constituent features. Any suitable physics-based measurement model may be used such as, but not limited to, an RCWA model, a FEM model, a method of moments model, a surface integral model, a volume integral model, or a FDTD model.

In some embodiments, the measurement model developed in step 304 includes an additional machine learning model, which may also be any suitable type of machine learning technique known in the art and may include any combination of learning techniques including, but not limited to, supervised, unsupervised, or reinforcement learning techniques. In some embodiments, the additional machine learning model is a neural network model. In this configuration, the additional machine learning model may identify patterns between the short loop optical metrology data and measurements of interest.

The additional machine learning model may be trained on any suitable training dataset. In some embodiments, the additional machine learning model is trained on experimentally-generated short loop optical metrology data (e.g., generated by an optical characterization sub-system 102) and experimentally-generated short loop reference data (e.g., generated by an x-ray characterization sub-system 102, a particle-beam characterization sub-system 102, or the like).

In some embodiments, the additional machine learning model is generated based on synthetic optical measurement data generated by a physics-based model described above. For example, the method 300 may include a step of generating synthetic measurement data using a physics-based measurement model with a range of parameters describing synthetic CuA devices 202. The method 300 may then include a step of training the additional machine learning model to generate the one or more measurements based on training data, where the training data includes at least one of the optical measurement data for the one or more training samples or the synthetic data describing the synthetic CuA devices 202. In this way, the physics-based model may be used to provide supplemental training data beyond the experimental data associated with the training and/or test samples described above (e.g., optical measurement data and/or reference data).

As an illustration, the synthetic measurement data may include synthesized equivalents of optical measurement data (e.g., that may be generated by an optical characterization sub-system 102) based on various combinations of geometric and dispersion parameters of CuA devices 202. For instance, different combinations of the geometric and dispersion parameters of the memory array structures 204 and the effective medium model of the CMOS structures 206 may be provided to the physics-based measurement model as inputs to generate synthetic measurement data as outputs. This synthetic measurement data may thus be characterized as a synthesized design of experiments (DOE) suitable for providing training data for the machine learning model.

The measurement model developed in step 304 may then be used during a fabrication process to generate measurements of additional samples with unknown properties (e.g., test samples).

In some embodiments, the method 300 includes a step 306 of generating full loop optical measurement data for CuA devices 202 on one or more test samples (e.g., with an optical characterization sub-system 102).

In some embodiments, the method 300 includes a step 308 of converting the full loop optical measurement data for the CuA devices 202 on the one or more test samples to short loop optical measurement data for the CuA devices 202 on the one or more test samples using the transformation model (e.g., from step 302).

In some embodiments, the method 300 includes a step 310 of determining values of the one or more measurements of the memory array structures 204 on the one or more test samples using the measurement model with the short loop optical measurement data for the CuA devices 202. Any suitable measurement of the memory array structures 204 may be generated such as, but not limited to an overlay measurement, a critical dimension (CD) measurement, a shape measurement (e.g., a height measurement, a tilt measurement, a sidewall angle measurement, or the like), a stress measurement, a composition measurement, a bandgap measurement, a measurement of electrical properties, a measurement of process conditions (e.g., focus and/or dose conditions, a resist state, a partial pressure, a temperature, a focusing model, or the like), an identification of defects, or a classification of defects.

The measurements of the memory array structures 204 on the test samples may then be utilized for a variety of purposes. In some embodiments, the measurements are used for process control, disposition, and/or estimating performance of the CuA devices 202 on the test samples. For example, the measurements may be used to generate correctables for one or more process tools (e.g., scanners, steppers, or the like) in a feedback and/or feedforward process.

Figure 1B:
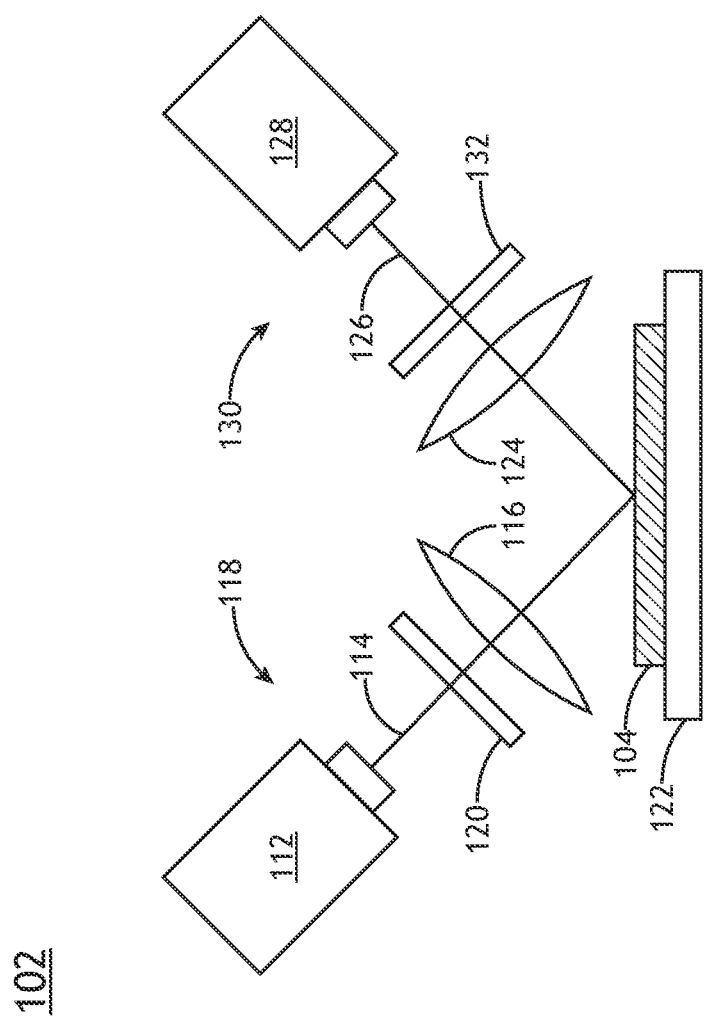
FIG. 1B is a simplified schematic of the characterization sub-system configured as an optical characterization sub-system, in accordance with one or more embodiments of the present disclosure.
Figure 1D:
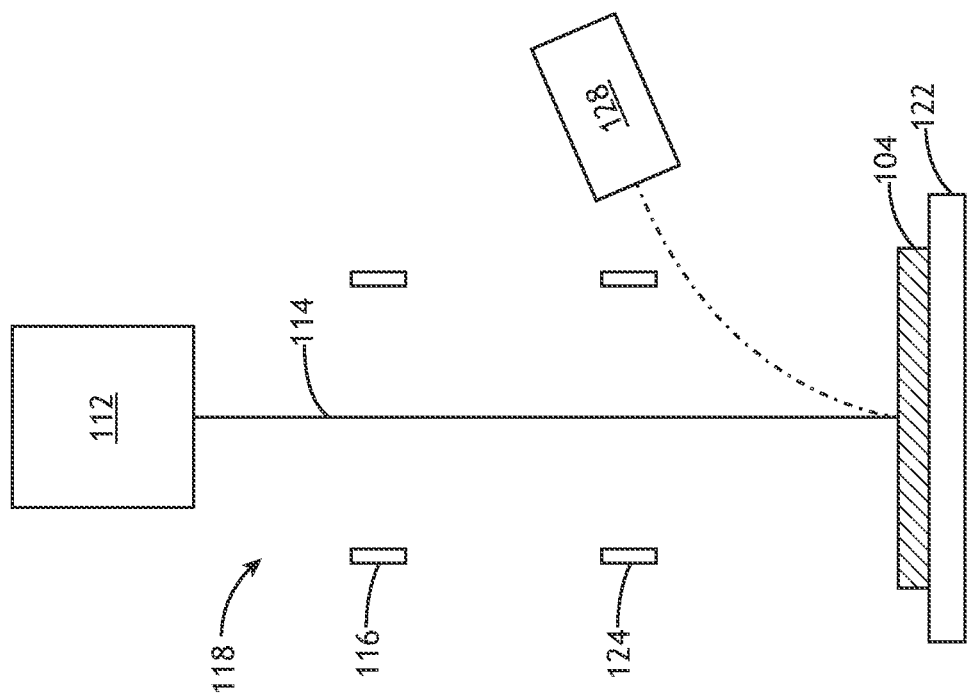
FIG. 1D is a simplified schematic of the characterization sub-system configured as a particle beam characterization sub-system, in accordance with one or more embodiments of the present disclosure.

Referring now to FIGS. 1B-1D, various non-limiting configurations of the characterization sub-system 102 are described in greater detail, in accordance with one or more embodiments of the present disclosure.

In some embodiments, the characterization sub-system 102 is an optical measurement sub-system that generates measurement data based on interaction of the sample 104 with light. FIG. 1B is a simplified schematic of the characterization sub-system 102 configured as an optical characterization sub-system 102, in accordance with one or more embodiments of the present disclosure. For example, the characterization sub-system 102 may include, but is not limited to, a spectroscopic ellipsometer (SE), an SE with multiple angles of illumination, an SE measuring Mueller matrix elements (e.g., using rotating compensator(s)), a single-wavelength ellipsometer, a beam profile ellipsometer (e.g., angle-resolved ellipsometer), a beam profile reflectometer (e.g., angle-resolved reflectometer), a broadband reflective spectrometer (e.g., spectroscopic reflectometer), a single-wavelength reflectometer, an angle-resolved reflectometer, an imaging system, a scatterometer (e.g., speckle analyzer), or any combination thereof.

In some embodiments, the characterization sub-system 102 includes an illumination source 112 configured to generate at least one illumination beam 114. The illumination from the illumination source 112 may include one or more selected wavelengths of light including, but not limited to, ultraviolet (UV) radiation, visible radiation, or infrared (IR) radiation. For example, the characterization sub-system 102 may include one or more apertures at an illumination pupil plane to divide illumination from the illumination source 112 into one or more illumination beams 114 or illumination lobes. In this regard, the characterization sub-system 102 may provide dipole illumination, quadrature illumination, or the like. Further, the spatial profile of the one or more illumination beams 114 on the sample 104 may be controlled by a field-plane stop to have any selected spatial profile.

The illumination source 112 may include any type of illumination source suitable for providing at least one illumination beam 114. In some embodiments, the illumination source 112 is a laser source. For example, the illumination source 112 may include, but is not limited to, one or more narrowband laser sources, a broadband laser source, a supercontinuum laser source, a white light laser source, or the like. In some embodiments, the illumination source 112 includes a laser-sustained plasma (LSP) source. For example, the illumination source 112 may include, but is not limited to, a LSP lamp, a LSP bulb, or a LSP chamber suitable for containing one or more elements that, when excited by a laser source into a plasma state, may emit broadband illumination. In some embodiments, the illumination source 112 includes a lamp source. In some embodiments, the illumination source 112 may include, but is not limited to, an arc lamp, a discharge lamp, an electrode-less lamp, or the like.

The illumination source 112 may provide the one or more illumination beams 114 using free-space techniques and/or optical fibers.

In some embodiments, the characterization sub-system 102 directs the illumination beam 114 to the sample 104 through at least one illumination lens 116 (e.g., an objective lens) via an illumination pathway 118. The illumination pathway 118 may include one or more optical components suitable for modifying and/or conditioning the illumination beam 114 as well as directing the illumination beam 114 to the sample 104. In some embodiments, the illumination pathway 118 includes one or more illumination-pathway optics 120 to shape or otherwise control the illumination beam 114. For example, the illumination-pathway optics 120 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

The characterization sub-system 102 may position the sample 104 for a measurement using any suitable technique. In some embodiments, as illustrated in FIG. 1B, the characterization sub-system 102 includes a sample stage 122 including one or more actuators (e.g., linear actuators, tip/tilt actuators, rotational actuators, or the like) to position the sample 104 with respect to the illumination beam 114. In some embodiments, though not explicitly shown, the characterization sub-system 102 includes beam-scanning optics (e.g., galvanometer mirrors, scanning prisms, or the like) to adjust a position and/or scan one or more illumination beams 114.

In some embodiments, the characterization sub-system 102 includes at least one collection lens 124 to capture light or other radiation emanating from the sample 104, which is referred to herein as collected light 126, and direct this collected light 126 to one or more detectors 128 through a collection pathway 130. The collection pathway 130 may include one or more optical elements suitable for modifying and/or conditioning the collected light 126 from the sample 104. In some embodiments, the collection pathway 130 includes one or more collection-pathway optics 132 to shape or otherwise control the collected light 126. For example, the collection-pathway optics 132 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

The characterization sub-system 102 may generally include any number or type of detectors 128. For example, the characterization sub-system 102 may include at least one single-pixel detector 128 such as, but not limited to, a photodiode, an avalanche photodiode, or a single-photon detector. As another example, the characterization sub-system 102 may include at least one multi-pixel detector 128 such as, but not limited to, a charge-coupled device (CCD) or a complementary metal-oxide semiconductor (CMOS) device, a line detector, or a time-delay integration (TDI) detector.

A detector 128 may be located at any selected location within the collection pathway 130. In some embodiments, the characterization sub-system 102 includes a detector 128 at a field plane (e.g., a plane conjugate to the sample 104) to generate an image of the sample 104. In some embodiments, the characterization sub-system 102 includes a detector 128 at a pupil plane (e.g., a diffraction plane) to generate a pupil image. In this regard, the pupil image may correspond to an angular distribution of light from the sample 104 detector 128. For instance, diffraction orders associated with diffraction of the illumination beam 114 from the sample 104 may be imaged or otherwise observed in the pupil plane. In a general sense, a detector 128 may capture any combination of reflected (or transmitted), scattered, or diffracted light from the sample 104.

The illumination pathway 118 and the collection pathway 130 of the characterization sub-system 102 may be oriented in a wide range of configurations. For example, as illustrated in FIG. 1B, the illumination pathway 118 and the collection pathway 130 may contain non-overlapping optical paths. In some embodiments, though not explicitly shown, the characterization sub-system 102 may include a beamsplitter oriented such that a common objective lens may simultaneously direct the illumination beam 114 to the sample 104 and capture collected light 126.

FIG. 1C is a simplified schematic of the characterization sub-system 102 configured as an x-ray characterization sub-system 102, in accordance with one or more embodiments of the present disclosure. Such a characterization sub-system 102 may be configured as, but is not limited to, a small-angle x-ray scatterometer (SAXR) or a soft x-ray reflectometer (SXR). X-ray characterization systems and associated measurement techniques are generally described in U.S. Pat. No. 7,929,667 issued on Apr. 19, 2011; U.S. Pat. No. 9,885,962 issued on Feb. 6, 2018; U.S. Pat. No. 10,013,518 issued on Jul. 3, 2018; U.S. Pat. No. 10,324,050 issued on Jun. 18, 2019; U.S. Pat. No. 10,352,695 issued on Jul. 16, 2019; U.S. Pat. No. 10,775,323 issued on Sep. 15, 2020; Germer, et al., "Intercomparison between optical and x-ray scatterometry measurements of FinFET structures" Proc. SPIE, v.8681, p. 86810Q (2013); Kline, et al. "X-ray scattering critical dimensional metrology using a compact x-ray source for next generation semiconductor devices." Journal of Micro/Nanolithography, MEMS, and MOEMS 16.1 (2017); U.S. Pat. No. 11,333,621 issued on May 17, 2022; and U.S. Patent Application No. 2021/0207956 published on Jul. 8, 2021; all of which are incorporated herein by reference in their entireties.

In some embodiments, the illumination source 112 is an x-ray source configured to generate an x-ray illumination beam 114 having any particle energies (e.g., soft x-rays, hard x-rays, or the like). The characterization sub-system 102 may then include any combination of components suitable for capturing an associated collection signal 134, which may include, but is not limited to, x-ray emissions, optical emissions, or particle emissions.

For example, the characterization sub-system 102 may include x-ray illumination lens 116 suitable for collimating or focusing an x-ray illumination beam 114 and collection pathway lenses (not shown) suitable for collecting, collimating, and/or focusing the collection signal 134 from the sample 104. Further, the characterization sub-system 102 may include various illumination-pathway optics (not shown) and/or collection-pathway optics (not shown) such as, but not limited to, x-ray collimating mirrors, specular x-ray optics such as grazing incidence ellipsoidal mirrors, polycapillary optics such as hollow capillary x-ray waveguides, multilayer optics, or systems, or any combination thereof. In embodiments, the characterization sub-system 102 includes an x-ray detector 128 such as, but not limited to, an x-ray monochromator (e.g., a crystal monochromator such as a Loxley-Tanner-Bowen monochromator, or the like), x-ray apertures, x-ray beam stops, or diffractive optics (e.g., such as zone plates).

FIG. 1D is a simplified schematic of the characterization sub-system 102 configured as a particle beam characterization sub-system 102, in accordance with one or more embodiments of the present disclosure.

In one embodiment, the illumination source 112 includes a particle source (e.g., an electron beam source, an ion beam source, or the like) such that the illumination beam 114 includes a particle beam (e.g., an electron beam, a particle beam, or the like). The illumination source 112 may include any particle source known in the art suitable for generating a particle illumination beam 114. For example, the illumination source 112 may include, but is not limited to, an electron gun or an ion gun. In another embodiment, the illumination source 112 is configured to provide a particle beam with a tunable energy. For example, an illumination source 112 including an electron source may, but is not limited to, provide an accelerating voltage in the range of 0.1 kilovolt (kV) to 30 kV. As another example, an illumination source 112 including an ion source may, but is not required to, provide an ion beam with an energy in the range of 1 kilo-electron-volte (keV) to 50 keV.

In another embodiment, the illumination pathway 118 includes one or more particle focusing elements (e.g., an illumination lens 116, a collection lens 124, or the like). For example, the one or more particle focusing elements may include, but are not limited to, a single particle focusing element or one or more particle focusing elements forming a compound system. In another embodiment, the one or more particle focusing elements include an illumination lens 116 configured to direct the particle illumination beam 114 to the sample 104. Further, the one or more particle focusing elements may include any type of electron lenses known in the art including, but not limited to, electrostatic, magnetic, uni-potential, or double-potential lenses.

In another embodiment, the characterization sub-system 102 includes one or more particle detectors 128 to image or otherwise detect particles emanating from the sample 104. For example, the detector 128 may include an electron collector (e.g., a secondary electron collector, a backscattered electron detector, or the like). As another example, the detector 128 may include a photon detector (e.g., a photodetector, an x-ray detector, a scintillating element coupled to photomultiplier tube (PMT) detector, or the like) for detecting electrons and/or photons from the sample surface.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, comprising:
a controller including one or more processors configured to execute program instructions causing the one or more processors to implement a measurement recipe by:
generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures;
generating a measurement model for determining one or more measurements of the CuA devices based on the short loop optical measurement data;
receiving the full loop optical measurement data for the CuA devices on one or more test samples;
converting the full loop optical measurement data for the CuA devices on the one or more test samples to the short loop optical measurement data for the CuA devices on the one or more test samples using the transformation model; and
determining values of the one or more measurements of the periodic memory array structures on the one or more test samples using the measurement model with the short loop optical measurement data for the CuA devices.

2. The system of claim 1, wherein generating the transformation model for transforming the full loop optical measurement data to the short loop optical measurement data comprises:
generating the short loop optical measurement data for a set of periodic memory array structures on one or more training samples;
generating short loop reference data for the set of periodic memory array structures on the one or more training samples;
generating the full loop optical measurement data for a set of the CuA devices on the one or more training samples;
generating full loop reference data for the set of the CuA devices on the one or more training samples; and
generating the transformation model based on the short loop optical measurement data for the set of periodic memory array structures on the one or more training samples, the short loop reference data for the set of periodic memory array structures on the one or more training samples, the full loop optical measurement data for the set of the CuA devices on the one or more training samples, and the full loop optical measurement data for the set of the CuA devices on the one or more training samples.

3. The system of claim 1, wherein the transformation model is a supervised machine learning model.

4. The system of claim 1, wherein the transformation model is a neural network.

5. The system of claim 1, wherein the transformation model is an unsupervised machine learning model.

6. The system of claim 1, wherein the measurement model is based on light-matter interaction with the periodic memory array structures.

7. The system of claim 6, wherein the measurement model utilizes at least one of:
a rigorous coupled wave analysis (RCWA) model, a finite element method (FEM) model, a method of moments model, a surface integral model, a volume integral model, or a finite difference time domain (FDTD) model.

8. The system of claim 1, wherein the measurement model is a supervised machine learning model.

9. The system of claim 1, wherein the measurement model is an unsupervised machine learning model.

10. A system, comprising:
an optical characterization system;
a controller communicatively coupled with the optical characterization system and a reference characterization system, the controller including one or more processors configured to execute program instructions causing the one or more processors to implement a measurement recipe by:
generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures;
generating a measurement model for determining one or more measurements of the CuA devices based on the short loop optical measurement data;
receiving the full loop optical measurement data for the CuA devices on one or more test samples;
converting the full loop optical measurement data for the CuA devices on the one or more test samples to the short loop optical measurement data for the CuA devices on the one or more test samples using the transformation model; and
determining values of the one or more measurements of the periodic memory array structures on the one or more test samples using the measurement model with the short loop optical measurement data for the CuA devices.

11. The system of claim 10, further comprising:
the reference characterization system;
wherein generating the transformation model for transforming the full loop optical measurement data to the short loop optical measurement data comprises:
generating the short loop optical measurement data for a set of periodic memory array structures on one or more training samples with the optical characterization system;
generating short loop reference data for the set of periodic memory array structures on the one or more training samples with the reference characterization system;
generating the full loop optical measurement data for a set of the CuA devices on the one or more training samples with the optical characterization system;

generating full loop reference data for the set of the CuA devices on the one or more training samples with the reference characterization system; and generating the transformation model based on the short loop optical measurement data for the set of periodic memory array structures on the one or more training samples, the short loop reference data for the set of periodic memory array structures on the one or more training samples, the full loop optical measurement data for the set of the CuA devices on the one or more training samples, and the full loop optical measurement data for the set of the CuA devices on the one or more training samples.

12. The system of claim 10, wherein the optical characterization system comprises:
at least one of an ellipsometer, a reflectometer, or a scatterometer.

13. The system of claim 10, wherein the reference characterization system comprises:
at least one of an x-ray characterization system or a particle-beam characterization system.

14. A method comprising:
generating a transformation model for transforming full loop optical measurement data to short loop optical measurement data, wherein the short loop optical measurement data includes optical measurement data of periodic memory array structures, wherein the full loop optical measurement data includes optical measurement data of complementary metal-oxide-semiconductor (CMOS) under array (CuA) devices, the CuA devices including CMOS structures beneath duplicates of the periodic memory array structures;

generating a measurement model for determining one or more measurements of the CuA devices based on the short loop optical measurement data;

generating the full loop optical measurement data for the CuA devices on one or more test samples;

converting the full loop optical measurement data for the CuA devices on the one or more test samples to the short loop optical measurement data for the CuA devices on the one or more test samples using the transformation model; and determining values of the one or more measurements of the periodic memory array structures on the one or more test samples using the measurement model with the short loop optical measurement data for the CuA devices.

15. The method of claim 14, wherein generating the transformation model for transforming the full loop optical measurement data to the short loop optical measurement data comprises:

generating the short loop optical measurement data for a set of periodic memory array structures on one or more training samples;

generating short loop reference data for the set of periodic memory array structures on the one or more training samples;

generating the full loop optical measurement data for a set of the CuA devices on the one or more training samples;

generating full loop reference data for the set of the CuA devices on the one or more training samples; and generating the transformation model based on the short loop optical measurement data for the set of periodic memory array structures on the one or more training samples, the short loop reference data for the set of periodic memory array structures on the one or more training samples, the full loop optical measurement data for the set of the CuA devices on the one or more training samples, and the full loop optical measurement data for the set of the CuA devices on the one or more training samples.

16. The method of claim 14, wherein the transformation model is a supervised machine learning model.

17. The method of claim 16, wherein the transformation model is a neural network.

18. The method of claim 14, wherein the transformation model is an unsupervised machine learning model.

19. The method of claim 14, wherein the measurement model is based on light-matter interaction with the periodic memory array structures.

20. The method of claim 19, wherein the measurement model utilizes at least one of:
a rigorous coupled wave analysis (RCWA) model, a finite element method (FEM) model, a method of moments model, a surface integral model, a volume integral model, or a finite difference time domain (FDTD) model.

21. The method of claim 14, wherein the measurement model is a supervised machine learning model.

22. The method of claim 14, wherein the measurement model is an unsupervised machine learning model.

* * * * *